(12) United States Patent
Kim

(10) Patent No.: US 10,784,430 B2
(45) Date of Patent: Sep. 22, 2020

(54) HEATING APPARATUS USING LIQUEFIED GAS

(71) Applicant: Bong June Kim, Seoul (KR)

(72) Inventor: Bong June Kim, Seoul (KR)

(*) Notice: Subject to any disclaimer, the term of this patent is extended or adjusted under 35 U.S.C. 154(b) by 117 days.

(21) Appl. No.: 15/757,503

(22) PCT Filed: Aug. 25, 2016

(86) PCT No.: PCT/KR2016/009459
§ 371 (c)(1),
(2) Date: Mar. 5, 2018

(87) PCT Pub. No.: WO2017/039231
PCT Pub. Date: Mar. 9, 2017

(65) Prior Publication Data
US 2018/0248099 A1 Aug. 30, 2018

(30) Foreign Application Priority Data
Sep. 3, 2015 (KR) .................. 10-2015-0125095

(51) Int. Cl.
*F23K 5/22* (2006.01)
*F24C 5/02* (2006.01)
(Continued)

(52) U.S. Cl.
CPC ............ *H01L 35/30* (2013.01); *F23D 11/441* (2013.01); *F23K 5/22* (2013.01); *F24C 5/02* (2013.01);
(Continued)

(58) Field of Classification Search
CPC .. F23D 11/441; F23K 5/22; F24C 5/18; F24C 5/02; H01L 35/30; F23M 2900/13003
(Continued)

(56) References Cited
U.S. PATENT DOCUMENTS
18,749,266 * 11/1930 Bentz
4,170,220 A * 10/1979 Smith .................. F24S 90/10
126/628
(Continued)

FOREIGN PATENT DOCUMENTS
JP 2004-129442 4/2004
KR 10-2003-0022649 3/2003
(Continued)

OTHER PUBLICATIONS
International Search Report for International Patent Application No. PCT/KR2016/009459 dated Dec. 2, 2016.

Primary Examiner — Grant Moubry
Assistant Examiner — Rabeeul I Zuberi
(74) Attorney, Agent, or Firm — Kunzler Bean & Adamson

(57) ABSTRACT

A heating apparatus using liquefied gas includes: a combustion unit where the liquefied gas is combusted in a vaporized state; a vaporization unit providing a vaporization space in which the liquefied gas supplied from a fuel receiving unit receiving the liquefied gas is vaporized and thermally separated from the combustion unit; and a thermoelectric element unit including a high-temperature input unit maintaining a high-temperature state by the combustion unit and a low-temperature input unit maintaining a relatively lower temperature than the high-temperature input unit by the liquefied gas vaporized in the vaporization unit and generating power by using a temperature difference between the high-temperature input unit and the low-temperature input unit, and the vaporization unit maintains a low-temperature state by using vaporization of the liquefied gas and is thermally separated from the combustion unit so as to prevent a temperature from rising by the combustion unit to increase power generation efficiency of the thermoelectric element unit.

8 Claims, 7 Drawing Sheets

(51) Int. Cl.
*F24C 5/18* (2006.01)
*F23D 11/44* (2006.01)
*H01L 35/30* (2006.01)

(52) U.S. Cl.
CPC ..... *F24C 5/18* (2013.01); *F23M 2900/13003* (2013.01)

(58) Field of Classification Search
USPC ............... 431/78–80; 126/623, 639, 708
See application file for complete search history.

(56) References Cited

U.S. PATENT DOCUMENTS

| | | | | |
|---|---|---|---|---|
| 4,408,593 A | * | 10/1983 | Furumoto | F23D 11/443 126/85 R |
| 2006/0172245 A1 | * | 8/2006 | Hu | F23D 14/06 431/354 |
| 2007/0186922 A1 | * | 8/2007 | Guenter | H01L 31/048 126/651 |

FOREIGN PATENT DOCUMENTS

| | | |
|---|---|---|
| KR | 10-2011-0044418 | 4/2011 |
| KR | 10-2012-0109417 | 10/2012 |
| KR | 10-1475756 | 12/2014 |
| KR | 10-1529219 | 6/2015 |

\* cited by examiner

[Fig. 1]
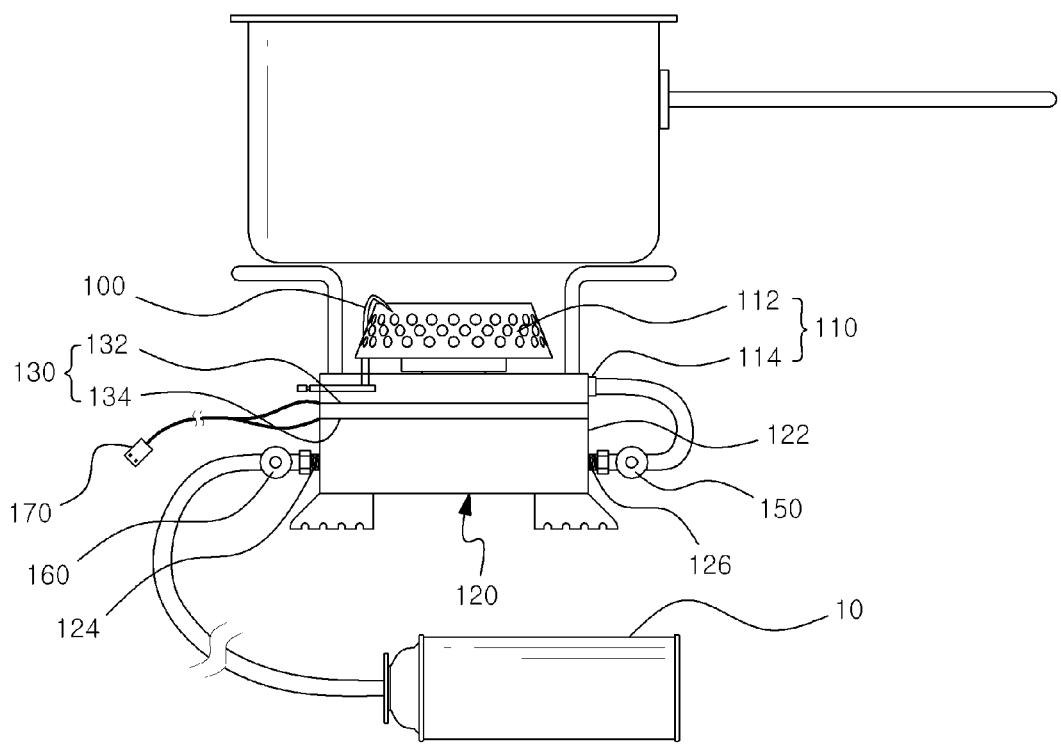

[Fig. 2]
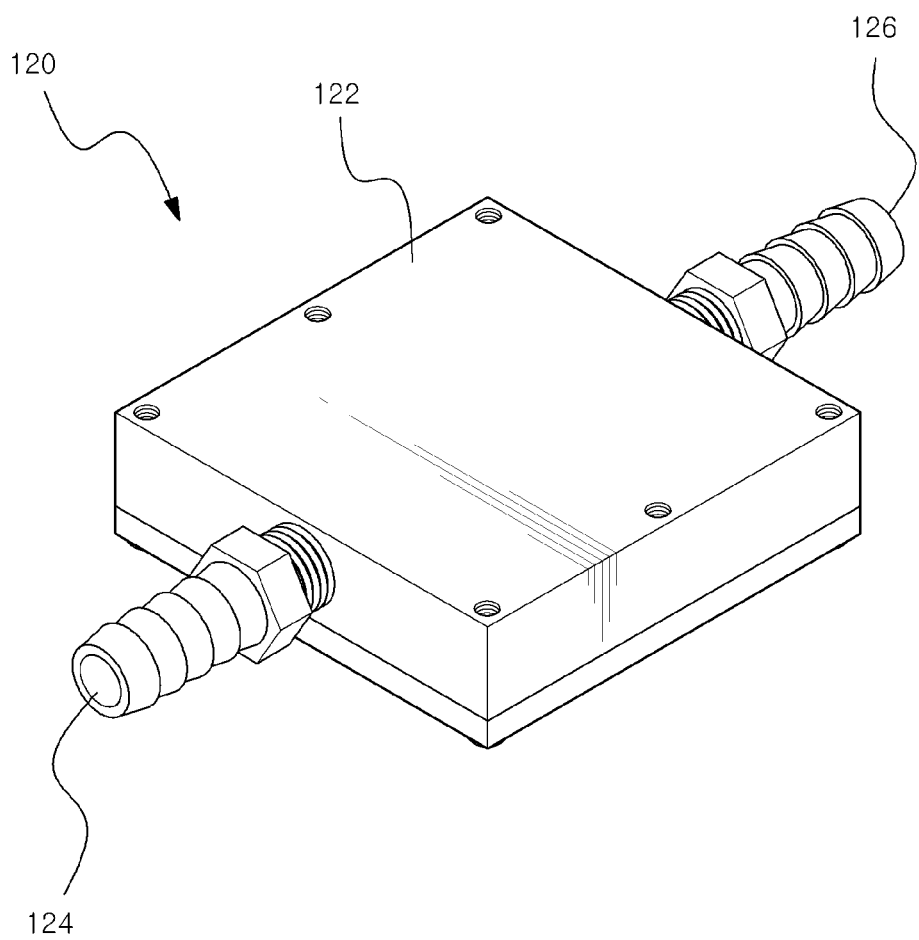

[Fig. 3]
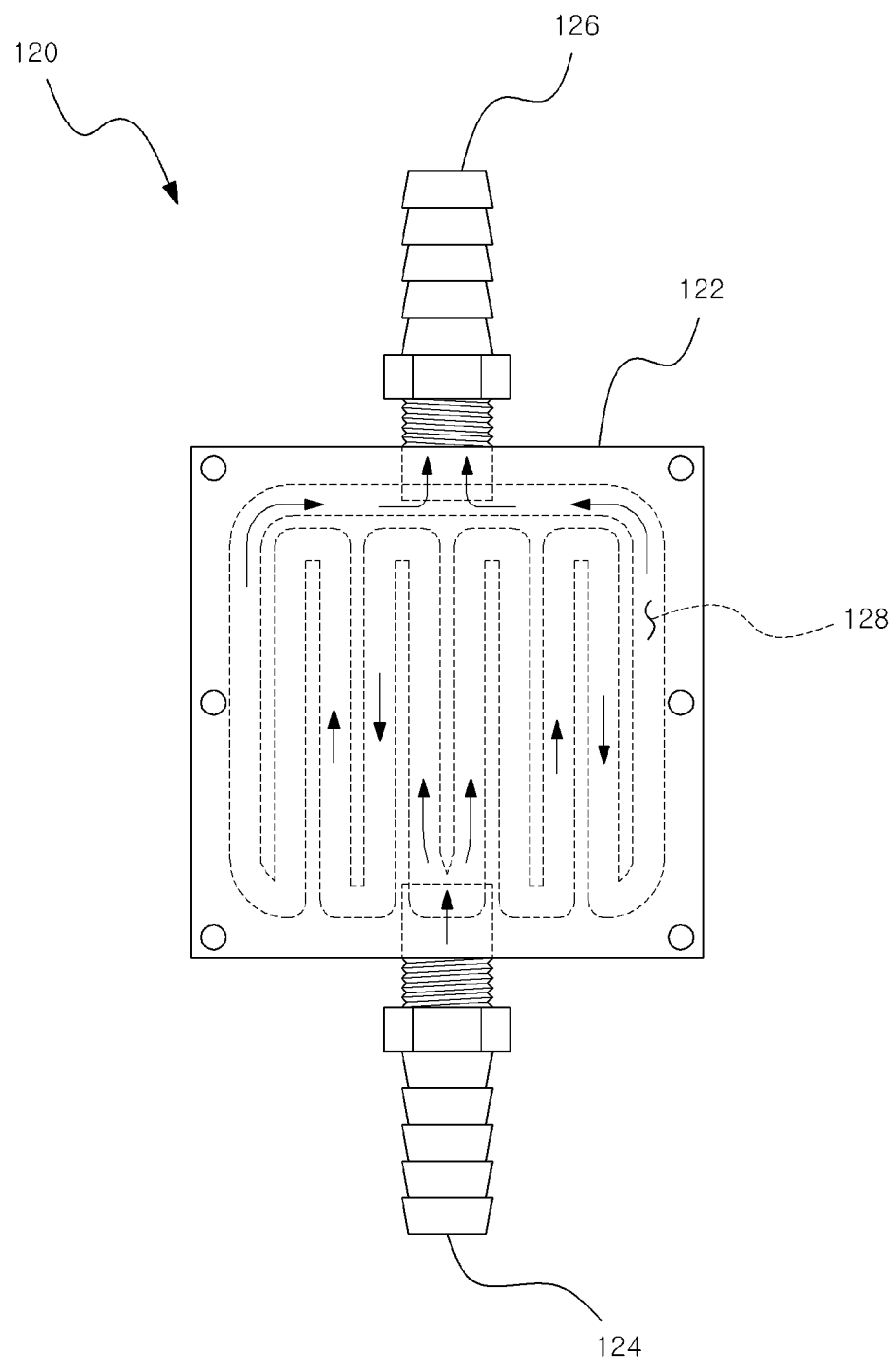

[Fig. 4]
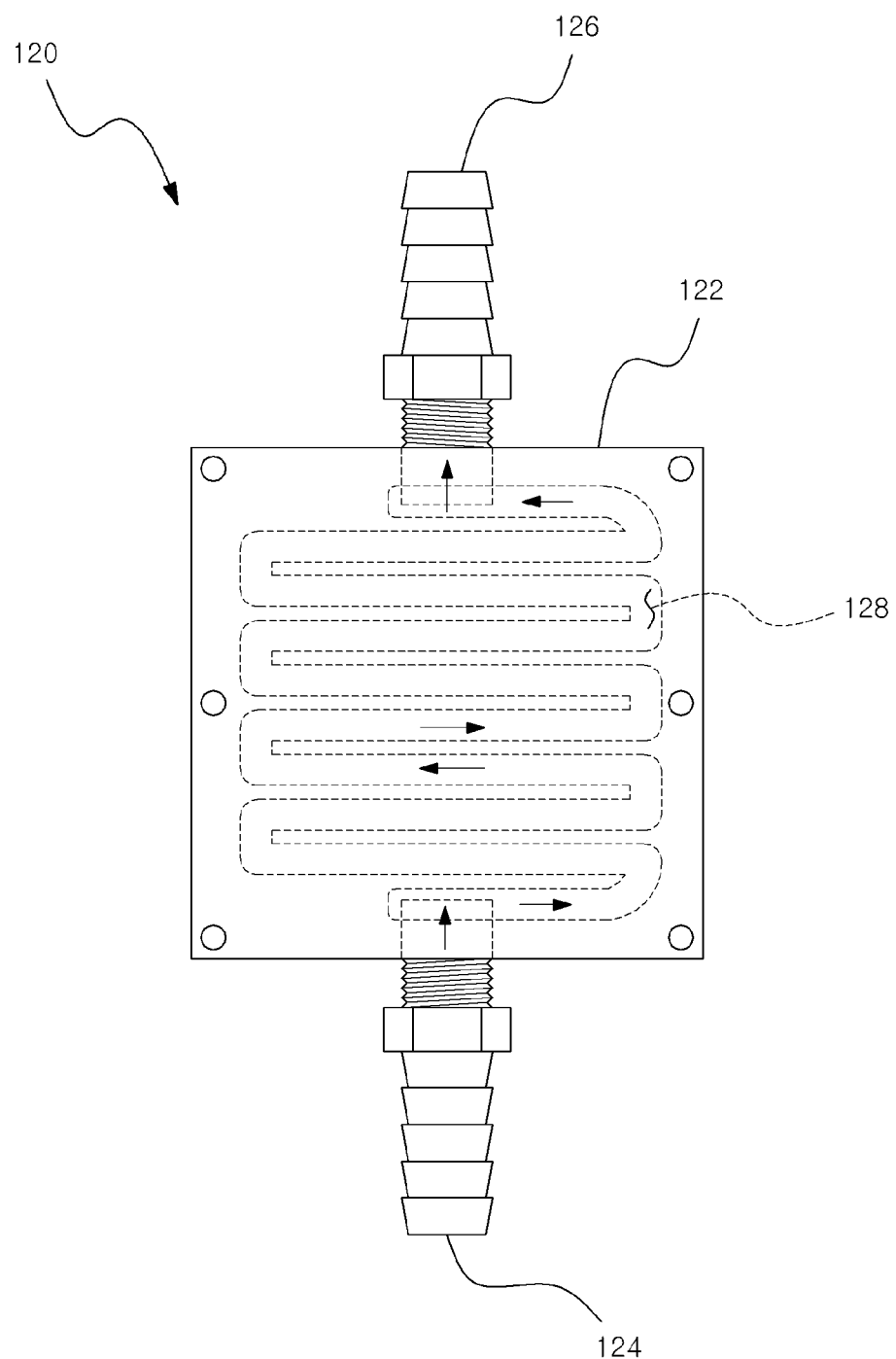

[Fig. 5]
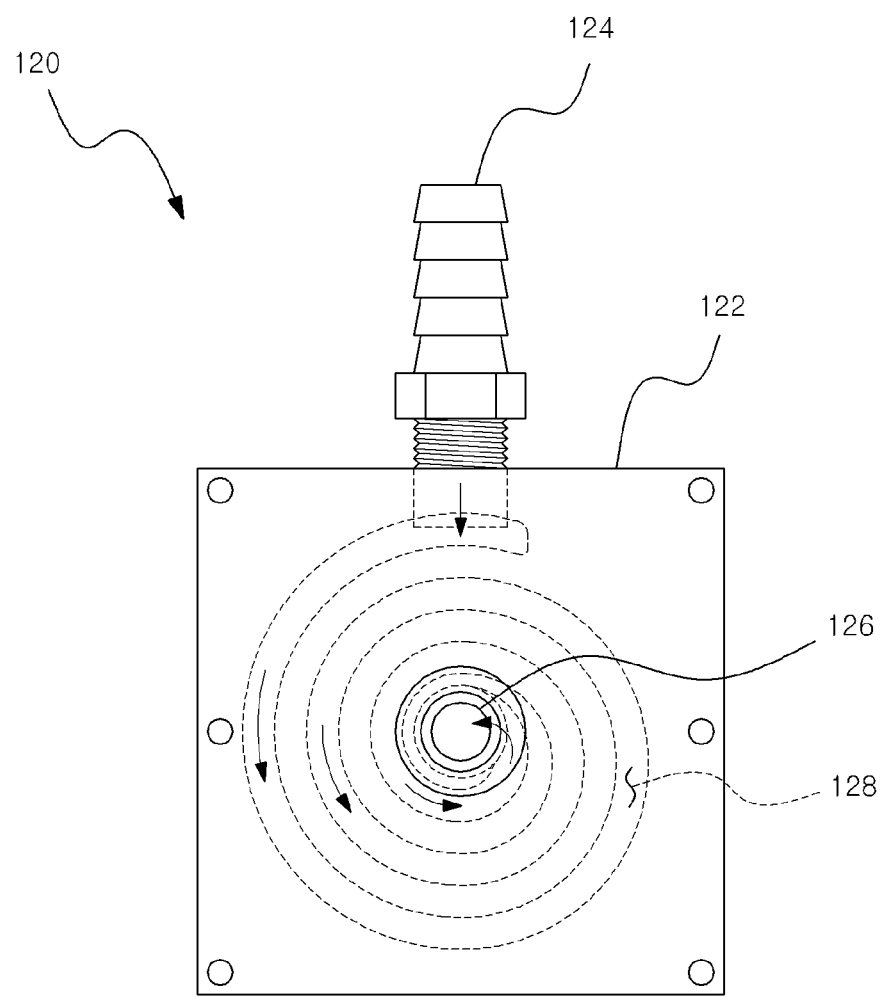

[Fig. 6]
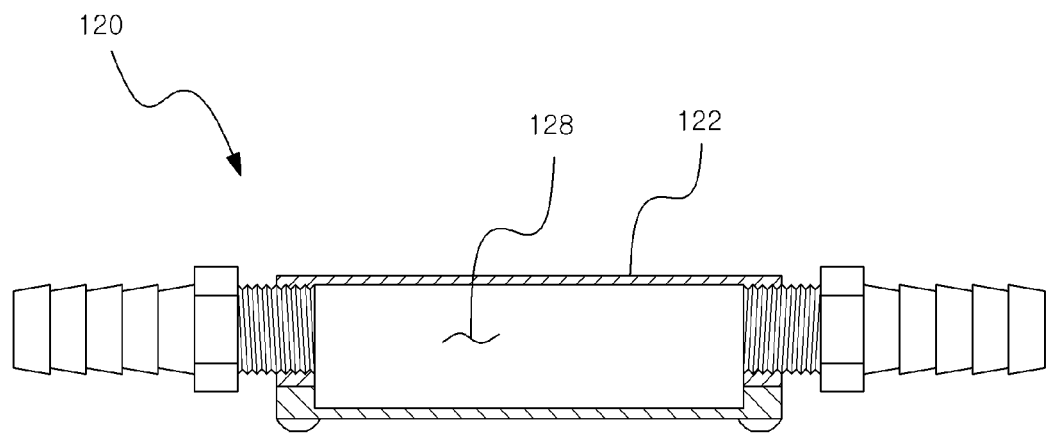
[Fig. 7]
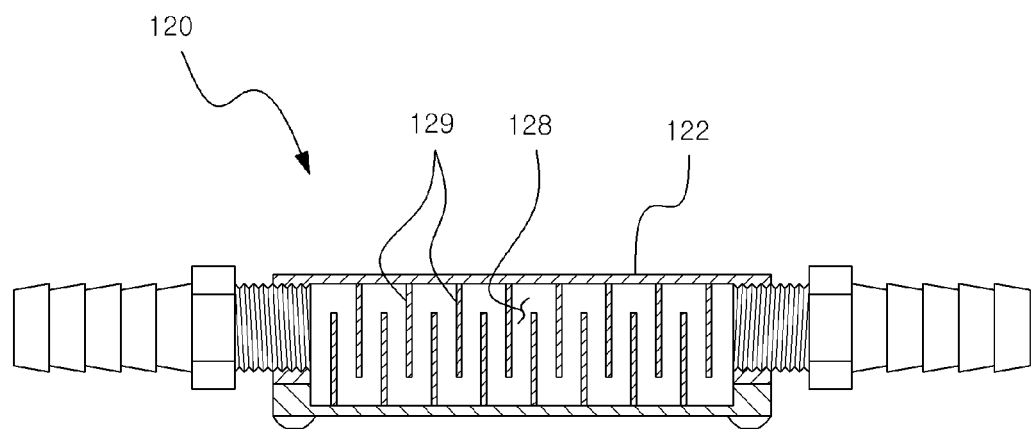

[Fig. 8]
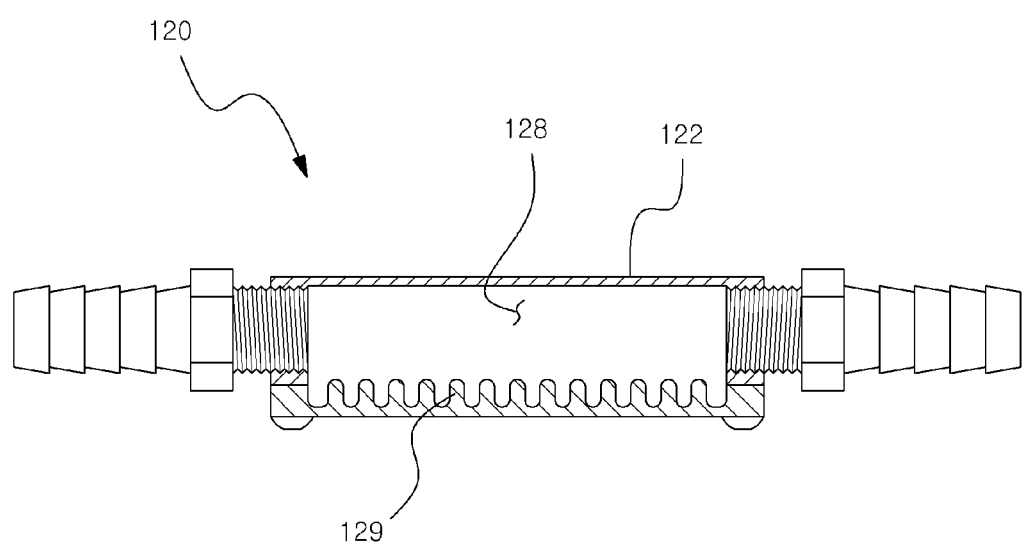

HEATING APPARATUS USING LIQUEFIED GAS

TECHNICAL FIELD

The present invention relates to a heating apparatus generating heat by using vaporized liquefied gas, and more particularly, to a heating apparatus capable of generating power by using heat of the heating apparatus.

BACKGROUND ART

Thermoelectric elements include an element using a seebeck effect which is a phenomenon in which electromotive force is generated by a temperature difference, an element using a Peltier effect which is a phenomenon in which heat is absorbed (or generated) by current, and the like.

A power generating apparatus using loss heat of a heating apparatus using gas as fuel is disclosed in Korean Patent Registration No. 10-1529219. The power generating apparatus includes a low-temperature conductive means in close contact with an outer circumferential surface of a gas tank and a high-temperature conductive means using high-temperature heat of an ignition unit and the thermoelectric element is attached onto an outer surface of the low-temperature conductive means to produce electricity using a temperature difference between the low-temperature conductive means and the high-temperature conductive means.

Besides, cooling and heating control devices for a gas container using a Peltier element are disclosed in Korean Patent Unexamined Publication No. 10-2012-0109417 and the device also produces the electricity using a low temperature in a gas container chamber and a high temperature of a combustor.

Further, a portable burner capable of producing the electricity is disclosed in Korean Patent Registration No. 10-1475756.

Thermoelectric power generation is a scheme that produces electric energy from thermal energy by using the seebeck effect and power generation performance is determined by the temperature difference between a high-temperature unit (combustion unit) and a low-temperature unit (vaporization unit) of the thermoelectric element.

All of the mentioned patents disclose an electricity producing method using the temperature difference and the mentioned patents use a cooling phenomenon which occurs outside a portable gas container.

Meanwhile, vaporization heat of a portable gas container is actually generated while liquid fuel discharged from a gas discharge port is vaporized and a position where a temperature decreases most corresponds to the gas discharge port where the liquid fuel is vaporized. However, the mentioned patents adopt a scheme that does not directly utilize a cooling phenomenon caused by the liquid fuel vaporized in the gas discharge port, but indirectly uses a temperature drop of the gas container due to the vaporization heat around the gas discharge port. Therefore, efficiency of the thermoelectric power generation using the temperature difference is not effective.

DETAILED DESCRIPTION OF INVENTION

Technical Problem

The present invention provides a heating apparatus capable of enhancing an effect of thermoelectric power generation by directly utilizing vaporization heat of liquefied gas vaporized while being discharged from a fuel receiving unit.

A heating apparatus in the related art serves to increase vaporization efficiency by transferring heat generated by combustion to a vaporization unit. However, when a temperature of the vaporization unit rises too much, the temperature of a low temperature unit also rises and power generation efficiency of a thermoelectric element may be lowered.

Accordingly, the present invention provides a heating apparatus which can increase the power generation efficiency of the thermoelectric element by blocking or minimizing the transfer of the combusted heat.

Technical Solution

According to a preferred embodiment of the present invention for achieving the objects of the present invention, a heating apparatus using liquefied gas includes: a combustion unit where the liquefied gas is combusted in a vaporized state; a vaporization unit providing a vaporization space in which the liquefied gas supplied from a fuel receiving unit receiving the liquefied gas is vaporized and thermally separated from the combustion unit; and a thermoelectric element unit including a high-temperature input unit maintaining a high-temperature state by the combustion unit and a low-temperature input unit maintaining a relatively lower temperature than the high-temperature input unit by the liquefied gas vaporized in the vaporization unit and generating power by using a temperature difference between the high-temperature input unit and the low-temperature input unit, and the vaporization unit maintains a low-temperature state by using vaporization of the liquefied gas and is thermally separated from the combustion unit so as to prevent a temperature from rising by the combustion unit to increase power generation efficiency of the thermoelectric element unit.

Further, the vaporization unit may include a vaporizer body including a fuel inflow port in which the vaporization space is integrally provided and through which the liquefied gas flows into the vaporization space from the fuel receiving unit and a fuel discharge port through which the liquefied gas is discharged in a vaporized state from the vaporization space to the combustion unit, and the thermoelectric element unit may be interposed between the combustion unit and the vaporization unit and the high-temperature input unit may be in close contact with the combustion unit and the low-temperature input unit may be in close contact with the vaporization unit.

A separate vaporization space is provided, and as a result, the liquefied gas discharged in a liquid state in which some liquid and some gas are mixed in the fuel receiving unit may be fully changed to a gas state in the vaporization space, thereby enhancing a cooling effect by vaporization heat.

Further, cooling by vaporization of the liquefied gas is achieved most in the vaporization unit to easily maintain a temperature difference between the combustion unit and the vaporization unit constantly and heat transferred from the combustion unit is maximally blocked, and as a result, stable power generation by the thermoelectric element unit is available.

In addition, a protruding structure which protrudes to the vaporization space on an inner surface of a vaporizer body forming the vaporization space may be formed in order to increase an inner area of the vaporization space.

Further, the vaporization unit may include a vaporizer body including a fuel inflow port in which the vaporization space is provided in a pipe shape and through which the liquefied gas flows into the vaporization space from the fuel receiving unit and a fuel discharge port through which the liquefied gas is discharged in a vaporized state from the vaporization space to the combustion unit, and the thermoelectric element unit may be interposed between the combustion unit and the vaporization unit and the high-temperature input unit may be in close contact with the combustion unit and the low-temperature input unit may be in close contact with the vaporization unit.

Further, the vaporization space having the pipe shape may be formed to be bent in the vaporizer body in order to increase a contact area of the liquefied gas and the vaporization ratio of the liquefied gas which flows in a fluid state. In addition, in the fuel inflow port, the vaporization space may be designed to be branched into at least two paths, which are recombined in the fuel discharge port.

Further, the vaporization unit may include the vaporizer body provided in the pipe shape and the vaporization space may be provided in the pipe, the fuel inflow port through which the liquefied gas flows into the vaporization space from the fuel receiving unit and the fuel discharge port through which the liquefied gas is discharged in the vaporized state from the vaporization space to the combustion unit may be formed on one end and the other end of the vaporizer body, and the thermoelectric element unit may be interposed between the combustion unit and the vaporization unit and the high-temperature input unit may be in close contact with the combustion unit and the low-temperature input unit may be in close contact with the vaporization unit.

Advantageous Effects

A heating apparatus according to the present invention is capable of generating power by using a low-temperature area by vaporization of liquefied gas and high-temperature heat of a combustion unit and provides a separate vaporization unit capable of fully vaporizing the liquefied gas discharged from a fuel receiving unit to supply the liquefied gas to the combustion unit by relatively increasing a vaporization ratio of the liquefied as compared with a case of directly supplying the liquefied gas from the fuel receiving unit to the combustion unit and thermally separates the combustion unit and a vaporization unit to prevent a temperature of the vaporization unit which is in contact with a low-temperature unit from excessively rising. Therefore, power generation efficiency of a thermoelectric element unit can be together enhanced.

Further, in the heating apparatus according to the present invention, cooling by vaporization of the liquefied gas is achieved most in the vaporization unit to easily maintain a temperature difference between the combustion unit and the vaporization unit constantly, and as a result, stable power generation is available.

DESCRIPTION OF DRAWINGS

FIG. 1 is a view illustrating a portable burner according to an embodiment of the present invention.

FIG. 2 is a perspective view of a vaporization unit.

FIG. 3 is a view illustrating an internal structure of the vaporization unit.

FIGS. 4 to 8 are views illustrating vaporizers applicable to a heating apparatus according to another embodiment of the present invention.

MODE FOR INVENTION

Hereinafter, embodiments of the present invention will be described in detail with reference to the accompanying drawings, but the present invention is not limited or restricted to the embodiments. For reference, in the description, like reference numerals substantially refer to like elements, which may be described by citing contents disclosed in other drawings under such a rule and contents determined to be apparent to those skilled in the art or repeated may be omitted.

First, a heating apparatus mentioned in the present invention may include a burner or a lamp, a stove, a gas heater, and the like capable of combusting liquefied gas. Hereinafter, in a specific embodiment of the present invention, the burner is exemplified as the heating apparatus and the heating apparatus is not limited to the burner.

The expressions of the liquefied gas and fuel liquefied gas used in the present specification refer to liquefaction of gas used as fuel and may refer to liquefaction with gas used for all fuels such as butane, propane, methane, and the like. A specific portable gas container of the present invention is exemplified as the liquefied gas which is called butane, but is not limited to butane gas.

FIG. 1 is a view illustrating a portable burner according to an embodiment of the present invention. FIG. 2 is a perspective view of a vaporization unit. FIG. 3 is a view illustrating an internal structure of the vaporization unit. FIGS. 4 to 8 are views illustrating vaporizers applicable to a heating apparatus according to another embodiment of the present invention.

Referring to FIGS. 1 to 8, a portable gas burner 100 may include a combustion unit 110, a vaporization unit 120, and a thermoelectric element unit 130 and further include an ignition unit 140 for igniting vaporized liquefied gas, a thermal power control unit 150 for controlling the amount of liquefied gas in a gaseous state discharged from the vaporization unit 120, a blocking unit 160 for selectively blocking the liquefied gas supplied from a fuel receiving unit 10 to the vaporization unit 120, and a power supply unit 170 for supplying power produced by the thermoelectric element unit 130 to an electronic apparatus in addition thereto and a member such as a power terminal may be used as the power supply unit 170.

The combustion unit 110 includes a flame dispersion unit 112 having multiple holes formed therein and capable of uniformly dispersing flames and a nozzle unit 114 connected to a fuel discharge port 126 of the vaporization unit 120 below the flame dispersion unit 114. The gaseous liquefied gas which flows into the nozzle unit 114 is uniformly dispersed in the flame dispersion unit 112 and ignited by the ignition unit 140 to maintain a combustion state.

The vaporization unit 120 is disposed closely to a lower part of the combustion unit 110, but connected to a separate fuel supply line to be thermally separated from the combustion unit 110. The vaporization unit 120 provides a vaporization space 128 therein and includes a vaporizer body 122 including a fuel inflow port 124 through which the liquefied gas partially vaporized from the fuel receiving unit 10 into a vaporization space 128 and a fuel discharge port 126 for supplying the liquefied gas fully vaporized in the vaporization space 128 to the combustion unit 110. The vaporization unit 120 may be made of a metallic material so as to easily conduct cooling air and high-temperature heat. However, the vaporizer body 122 may be made of the metallic material for enhancing vaporization efficiency and for smooth heat conduction with the outside.

In general, gas discharged from a portable gas container is not completely vaporized, and includes even some liquid fuel. Therefore, a cooling effect by vaporization heat is inevitably lower than the cooling effect when the liquefied gas is completely vaporized. Further, in order to increase the cooling effect for increasing thermoelectric power generation efficiency, the portable gas container is erected upside down to guide the liquefied gas to the vaporization unit 120.

However, in the heating apparatus according to the present invention, the liquefied gas discharged from the fuel receiving unit 10 may be completely vaporized in a separate space, and as a result, the cooling effect by the vaporization may be enhanced and the power generation efficiency may be increased.

In particular, the vaporization unit 120 according to the present invention may maximize the cooling effect by just utilizing the vaporization heat of the liquefied gas discharged from the portable gas container.

Specifically, data are attached, which are acquired by comparing and analyzing an outside temperature of the portable gas container described below and the vaporization heat of the gas discharge port.

A case where the portable gas container receives butane liquefied gas is experimented and a gas ejection time is set to 1 minute, an outdoor temperature is set to 27.4° C., and a measurement tolerance is ±0.2.

TABLE 1

| Classification | Outside temperature (° C.) of portable gas container | Temperature (° C.) of gas outlet | Each temperature difference (° C.) of outside and outlet of portable gas container |
| --- | --- | --- | --- |
| Before gas ejection | 27.5 | 27.4 | −0.1 (within tolerance range) |
| After gas ejection | 27.1 | −29.6 | −56.7 |
| Temperature change | −0.4 | −57 | |

In the case where the gas is ejected from the portable gas container (butane liquefied gas) for one minute at the outdoor temperature of 27.4° C., the temperature change of the gas outlet is changed by −57 and a butane gas liquid partially leaks and may not thus be vaporized, and as a result, it is verified that the butane gas liquid exists in a form of ice.

That is, the cooling effect by the vaporization heat of vaporization is relatively small in another outer area other than an outlet of the portable gas container. In such a situation, according to the present invention, the effect of the thermoelectric power generation is maximized by disposing the vaporization unit in the outlet of a gas container and utilizing most of the vaporization heat.

The thermoelectric element unit 130 includes a high-temperature input unit 132 closely contacting the combustion unit 110 so as to maintain a high-temperature state by the combustion unit 110 and a low-temperature input part 134 which maintains a relatively lower temperature than the high-temperature input unit 132 by the liquefied gas vaporized in the vaporization unit 120 and may generate power by using the temperature difference between the high-temperature input unit 132 and the low-temperature input unit 134.

The high-temperature input unit 132 of the thermoelectric element unit 130 may correspond to an upper part of the thermoelectric element unit as a part which is in close contact with the combustion unit 110 and the low-temperature input unit 134 may correspond to a lower part of the thermoelectric element unit 130 as a part which is in close contact with the vaporization unit 120.

In addition, the power generated by the thermoelectric element unit 130 may be transferred to the power supply unit 170 by a cable connected to an upper surface and a lower surface of the thermoelectric element unit 130.

As illustrated in FIG. 3, the vaporization unit 120 is provided with a fluid passage through which the liquefied gas flows in a pipe shape and the passage corresponds to the vaporization space 128. In addition, the vaporization space 128 in the vaporization unit 120 is designed to be separated at the fuel inflow port 124 and recombined at the fuel discharge port 126. Of course, the vaporization space 128 in the vaporization unit 120 may be provided as one passage from the fuel inflow port 124 up to the fuel discharge port 126 as illustrated in FIG. 4 and the vaporization space 128 in the vaporization unit 120 may be provided in the form of a whirl or a spiral as illustrated in FIG. 5.

Further, as illustrated in FIG. 3 or 4, the fuel inflow port or the fuel discharge port need not be continuously formed in an opposite direction in the vaporizer body and as illustrated in FIG. 5, the fuel inflow port or the fuel discharge port may be formed on a lateral surface and the upper and lower surfaces of the vaporizer body. This may be changed in consideration of a position and a shape of a nozzle for transferring the vaporized fuel to the combustion unit and as illustrated in FIGS. 3 to 5, the vaporization space provided in various shapes may further branch the passage or change the passage to other shapes so as to increase a vaporization ratio.

The thermoelectric element unit 130 is interposed between the combustion unit 110 and the vaporization unit 120 so that the high-temperature input unit 132 is in close contact with the combustion unit 110 and the low-temperature input unit 134 is in close contact with the vaporization unit 120.

Further, the vaporization space 128 which is provided in a pipe shape to increase a contact area of the liquefied gas flowing in a fluid state and the vaporization ratio of the liquefied gas is formed in a bent state inside the vaporizer body 122 and a length or an inner diameter or the number of bending times of the vaporization space 128 may be appropriately adjusted to increase the vaporization ratio of the liquefied gas.

For reference, the vaporization unit 120 is provided in a hexahedron shape in the embodiment, but it may be designed in a cylindrical or polygonal shape in consideration of an overall shape of the burner. The present invention is not limited by an outer shape of the vaporization unit 120.

Meanwhile, the vaporization unit illustrated in FIG. 6 may be applied to a heating apparatus according to another embodiment of the present invention and the same reference numerals are used for the same constitution for easy description or to facilitate comparison with the vaporization unit of the embodiment. Referring to FIG. 6, in the vaporization unit 120 illustrated in FIG. 6, the vaporization space 128 provided in the vaporization unit 120 is integrally formed to correspond to the outer shape of the vaporizer body 122. For example, when the vaporizer body 122 is provided in a hexahedron, the vaporization space 128 may also be provided in the hexahedron. However, the shapes of the vaporizer body and the vaporization space are provided similarly in order to increase spatial utilization and the shape of the vaporization space 128 and the outer shape of the vaporizer body 122 need not be the same as each other.

In addition, the vaporization unit 120 illustrated in FIG. 7 includes a protruding structure 129 so that the liquefied gas in the fluid state has a high vaporization ratio in the vaporization space 128.

The protruding structure 129 protrudes toward the vaporization space 128 from an inner surface of the vaporizer body 122 forming the vaporization space 128 for increasing an inner area of the vaporization space 128.

Although the vaporization unit 120 illustrated in FIG. 7 provides the protruding structure 129 having a partition shape, but may be provided variously in a columnar shape within a range that may increase the inner area or increase a path of the liquefied gas which flows therein.

Further, as illustrated in FIG. 8, the vaporization unit 120 may be provided with two separated bodies which are combined, and a sealing member such as a packing may be disposed therebetween. In FIG. 8, the protruding structure 129 may be provided in a shape protruding from one inner surface of one specific vaporizer body of two separated vaporizer bodies 122. In particular, in the embodiment, the structure is disposed so that a front part immediately in front of the discharge port or the inflow port is not covered by the protruding structure, thereby facilitating inflow or discharge of fuel.

As described above, the present invention has been described with reference to the embodiments of the present invention. However, it will be appreciated by those skilled in the art that various modifications and changes of the present invention can be made without departing from the spirit and the scope of the present invention which are defined in the appended patent claims.

The invention claimed is:

1. A heating apparatus using liquefied gas, comprising:
a combustion unit where the liquefied gas is combusted in a vaporized state;
a vaporization unit located outside of the combustion unit, the vaporization unit providing a vaporization space in which the liquefied gas supplied from a fuel receiving unit receiving the liquefied gas is vaporized, wherein the vaporization unit is physically separated from the combustion unit so as not to receive heat directly from the combustion unit; and
a thermoelectric element unit located between the combustion unit and the vaporization unit, the thermoelectric element including a high-temperature input unit maintaining a high-temperature state by the combustion unit and a low-temperature input unit maintaining a relatively lower temperature than the high-temperature input unit by the liquefied gas vaporized in the vaporization unit and generating power by using a temperature difference between the high-temperature input unit and the low-temperature input unit,
wherein heat, for vaporizing the liquefied gas in the vaporization unit, is received directly from the thermoelectric element,
wherein the vaporization unit maintains a low-temperature state by using vaporization of the liquefied gas and is thermally separated from the combustion unit so as to prevent a temperature from rising by the combustion unit to increase power generation efficiency of the thermoelectric element unit,
wherein the vaporization unit comprises:
a vaporizer body including a fuel inflow port in which the vaporization space is provided in a pipe shape and through which the liquefied gas flows into the vaporization space from the fuel receiving unit and a fuel discharge port through which the liquefied gas is discharged in a vaporized state from the vaporization space to the combustion unit, and
the thermoelectric element unit is interposed between the combustion unit and the vaporization unit and the high-temperature input unit is in close contact with the combustion unit and the low-temperature input unit is in close contact with the vaporization unit, and
in the fuel inflow port, the vaporization space is branched into at least two paths, which are recombined in the fuel discharge port.

2. The heating apparatus of claim 1, wherein the vaporization unit comprises:
a vaporizer body including a fuel inflow port in which the vaporization space is integrally provided and through which the liquefied gas flows into the vaporization space from the fuel receiving unit and a fuel discharge port through which the liquefied gas is discharged in a vaporized state from the vaporization space to the combustion unit, and
the thermoelectric element unit is interposed between the combustion unit and the vaporization unit and the high-temperature input unit is in close contact with the combustion unit and the low-temperature input unit is in close contact with the vaporization unit.

3. The heating apparatus of claim 2, wherein a protruding structure which protrudes to the vaporization space on an inner surface of a vaporizer body forming the vaporization space is formed in order to increase a vaporization area of the vaporization space.

4. The heating apparatus of claim 1, wherein:
the vaporization unit includes the vaporizer body provided in the pipe shape and the vaporization space is provided in the pipe,
the fuel inflow port through which the liquefied gas flows into the vaporization space from the fuel receiving unit and the fuel discharge port through which the liquefied gas is discharged in the vaporized state from the vaporization space to the combustion unit are formed on one end and the other end of the vaporizer body, and
the thermoelectric element unit is interposed between the combustion unit and the vaporization unit and the high-temperature input unit is in close contact with the combustion unit and the low-temperature input unit is in close contact with the vaporization unit.

5. A heating apparatus using liquefied gas, comprising:
a combustion unit where the liquefied gas is combusted in a vaporized state;
a vaporization unit located outside of the combustion unit, the vaporization unit providing a vaporization space in which the liquefied gas supplied from a fuel receiving unit receiving the liquefied gas is vaporized, wherein the vaporization unit is physically separated from the combustion unit so as not to receive heat directly from the combustion unit; and
a thermoelectric element unit located between the combustion unit and the vaporization unit, the thermoelectric element including a high-temperature input unit maintaining a high-temperature state by the combustion unit and a low-temperature input unit maintaining a relatively lower temperature than the high-temperature input unit by the liquefied gas vaporized in the vaporization unit and generating power by using a temperature difference between the high-temperature input unit and the low-temperature input unit,
wherein heat, for vaporizing the liquefied gas in the vaporization unit, is received directly from the thermoelectric element, wherein the vaporization unit maintains a low-temperature state by using vaporization of the liquefied gas and is thermally separated from the combustion unit so as to prevent a temperature from rising by the combustion unit to increase power generation efficiency of the thermoelectric element unit, wherein the vaporization unit comprises:

a vaporizer body including a fuel inflow port in which the vaporization space is provided in a pipe shape and through which the liquefied gas flows into the vaporization space from the fuel receiving unit and a fuel discharge port through which the liquefied gas is discharged in a vaporized state from the vaporization space to the combustion unit, and the thermoelectric element unit is interposed between the combustion unit and the vaporization unit and the high-temperature input unit is in close contact with the combustion unit and the low-temperature input unit is in close contact with the vaporization unit, and wherein the vaporization space having the pipe shape is formed to be bent in the vaporizer body in order to increase a contact area of the liquefied gas and the vaporization ratio of the liquefied gas which flows in a fluid state.

6. The heating apparatus of claim 5, wherein the vaporization unit comprises:

a vaporizer body including a fuel inflow port in which the vaporization space is integrally provided and through which the liquefied gas flows into the vaporization space from the fuel receiving unit and a fuel discharge port through which the liquefied gas is discharged in a vaporized state from the vaporization space to the combustion unit, and the thermoelectric element unit is interposed between the combustion unit and the vaporization unit and the high-temperature input unit is in close contact with the combustion unit and the low-temperature input unit is in close contact with the vaporization unit.

7. The heating apparatus of claim 6, wherein a protruding structure which protrudes to the vaporization space on an inner surface of a vaporizer body forming the vaporization space is formed in order to increase a vaporization area of the vaporization space.

8. The heating apparatus of claim 5, wherein:

the vaporization unit includes the vaporizer body provided in the pipe shape and the vaporization space is provided in the pipe, the fuel inflow port through which the liquefied gas flows into the vaporization space from the fuel receiving unit and the fuel discharge port through which the liquefied gas is discharged in the vaporized state from the vaporization space to the combustion unit are formed on one end and the other end of the vaporizer body, and the thermoelectric element unit is interposed between the combustion unit and the vaporization unit and the high-temperature input unit is in close contact with the combustion unit and the low-temperature input unit is in close contact with the vaporization unit.

* * * * *